US010514398B2

(12) United States Patent
De Cesaris

(10) Patent No.: US 10,514,398 B2
(45) Date of Patent: Dec. 24, 2019

(54) INVERTER REGULATION

(71) Applicant: SCHNEIDER ELECTRIC IT CORPORATION, West Kingston, RI (US)

(72) Inventor: Stefano De Cesaris, Grenoble (FR)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 0 days.

(21) Appl. No.: 15/100,861

(22) PCT Filed: Dec. 4, 2013

(86) PCT No.: PCT/US2013/073010
§ 371 (c)(1),
(2) Date: Jun. 1, 2016

(87) PCT Pub. No.: WO2015/084337
PCT Pub. Date: Jun. 11, 2015

(65) Prior Publication Data
US 2016/0299177 A1    Oct. 13, 2016

(51) Int. Cl.
*G01R 19/00* (2006.01)
*H02M 1/12* (2006.01)
(Continued)

(52) U.S. Cl.
CPC .......... *G01R 19/0092* (2013.01); *H02J 9/062* (2013.01); *H02M 1/126* (2013.01); *H02M 7/53871* (2013.01); *H02M 2001/0009* (2013.01)

(58) Field of Classification Search
CPC .............. G01R 19/0092; H02M 1/126; H02M 7/53871; H02M 2001/0009; H02J 9/062
See application file for complete search history.

(56) References Cited

U.S. PATENT DOCUMENTS 4,333,046 A    6/1982    Lee
5,309,349 A    5/1994    Kwan
(Continued)

FOREIGN PATENT DOCUMENTS

CN    1389737 A    1/2003
CN    101246187 A    8/2008
(Continued)

OTHER PUBLICATIONS

Caceres et al. A Boost DC-AC Converter: Analysis, Design, and Experimentation. IEEE Transactions on Power Electronics, vol. 14, No. 1, Jan. 1999. [retrieved on Mar. 25, 2014] Retrieved from the Internet <URL:http://www.bbs.dianyuan.com/bbs/u/31/1122209973. pdf>. entire document.
(Continued)

*Primary Examiner* — Christopher P McAndrew
*Assistant Examiner* — Zannatul Ferdous
(74) *Attorney, Agent, or Firm* — Lando & Anastasi, LLP

(57) ABSTRACT

According to various aspects and embodiments, a power device is provided. The power device includes an input configured to receive input power, an output configured to provide output power to a load, a power conversion circuit coupled to the input and configured with a first output line and a second output line, the first output line coupled to the output and configured to provide output current at the output, a capacitor coupled to a junction of the first output line and the output, and coupled to the second output line, and a controller coupled to the power conversion circuit. The controller is configured to receive a first current measurement for the first output line receive a first voltage measurement across the capacitor, and determine a load current based on the first current measurement and the first voltage measurement.

23 Claims, 6 Drawing Sheets

(51) Int. Cl.
*H02M 7/5387* (2007.01)
*H02J 9/06* (2006.01)
*H02M 1/00* (2006.01)

(56) References Cited

U.S. PATENT DOCUMENTS

| | | | |
|---|---|---|---|
| 5,555,165 A * | 9/1996 | Vinciarelli | H02M 3/10 363/20 |
| 5,670,864 A * | 9/1997 | Marx | G05F 1/70 323/210 |
| 6,069,801 A | 5/2000 | Hodge, Jr. et al. | |
| 6,208,537 B1 | 3/2001 | Skibinski et al. | |
| 6,642,690 B2 | 11/2003 | Kim | |
| 7,432,616 B2 | 10/2008 | Hatai et al. | |
| 8,854,026 B2 | 10/2014 | Karlsson et al. | |
| 8,963,535 B1 * | 2/2015 | Melanson | G01R 33/07 307/116 |
| 2004/0095266 A1 | 5/2004 | Kernahan et al. | |
| 2005/0219880 A1 | 10/2005 | Nagai et al. | |
| 2007/0297200 A1 | 12/2007 | Ranstad | |
| 2008/0112202 A1 * | 5/2008 | Hu | H02M 7/5387 363/132 |
| 2009/0002343 A1 | 1/2009 | Land et al. | |
| 2009/0122580 A1 * | 5/2009 | Stamm | H02M 7/15 363/44 |
| 2011/0007537 A1 | 1/2011 | Fornage | |
| 2011/0278934 A1 | 11/2011 | Ghosh et al. | |
| 2012/0112772 A1 | 5/2012 | Huang | |
| 2012/0163046 A1 | 6/2012 | Hibino | |
| 2013/0193945 A1 * | 8/2013 | Adest | H01L 31/02021 323/299 |
| 2014/0002044 A1 | 1/2014 | Babazadeh et al. | |
| 2014/0265897 A1 * | 9/2014 | Taipale | H05B 37/02 315/200 R |
| 2015/0036397 A1 | 2/2015 | Wang et al. | |
| 2015/0180279 A1 * | 6/2015 | Nielsen | H02M 7/487 307/64 |
| 2016/0268890 A1 | 9/2016 | Ayai et al. | |
| 2016/0329829 A1 | 11/2016 | Ayai et al. | |

FOREIGN PATENT DOCUMENTS

| | | |
|---|---|---|
| CN | 102095918 A | 6/2011 |
| CN | 102291033 A | 12/2011 |
| CN | 102804577 A | 11/2012 |
| EP | 0576271 A2 | 12/1993 |
| EP | 1280264 A2 | 1/2003 |
| EP | 1406373 A2 | 4/2004 |
| EP | 1959551 A1 | 8/2008 |
| EP | 2390997 A2 | 11/2011 |
| WO | 2004047263 A2 | 6/2004 |
| WO | 20120124223 A1 | 9/2012 |
| WO | 2015084337 A1 | 6/2015 |
| WO | 20150105081 A1 | 7/2015 |

OTHER PUBLICATIONS

Notification of Transmittal of the International Search Report and the Written Opinion of the International Searching Authority from corresponding PCT/US2013/073010 dated Aug. 13, 2014.
Extended European Search Report from corresponding European Application No. 13898528.8 dated Aug. 14, 2017.
Kükrer, O: "Deadbeat Control of a Three-Phase Inverter with an Output LC Filter," IEEE Transactions on Power Electronics, Institute of Electrical and Electronics Engineers, USA, vol. 11, No. 1, Jan. 31, 1996 (Jan. 31, 1996), XP011042923, ISSN: 0885-8993, pp. 16-23.
Spiazzi G et al: "Single phase line frequency commutated voltage source inverter suitable for fuel cell interfacing", Power Electronics Specialists Conference; [Annual Power Electronics Specialists Conference], vol. 2, Jun. 23, 2002 (Jun. 23, 2002), pp. 734-739, XP010747421, ISBN: 978-0-7803-7262-7.

* cited by examiner

INVERTER REGULATION

CROSS-REFERENCE TO RELATED APPLICATIONS

This application is a U.S. National Stage Application under 35 U.S.C. § 371 of International Application No. PCT/US2013/073010, filed Dec. 4, 2013, titled IMPROVEMENT OF INVERTER REGULATION, which is hereby incorporated herein by reference in its entirety.

BACKGROUND

Technical Field

Embodiments of the present disclosure relate generally to power inverters. More specifically, embodiments relate to systems and methods for determining inverter output current without the use of current transformers.

Background Discussion

Inverters are used to convert Direct Current (DC), the form of electricity produced by solar panels and batteries, to Alternating Current (AC). Inverters are used in a variety of different power systems. For example, inverters are commonly used in uninterruptible power supplies (UPSs) to provide regulated, uninterrupted power for sensitive and/or critical loads, such as computer systems and other data processing systems Current Transformers (CT) are commonly used to monitor current at the output of an inverter. A CT typically includes a coil with a number of windings and a resistive element. A CT may be used to measure the output current by producing a reduced current signal, proportionate to the output current, which may be further manipulated and measured. The reduced current AC signal may then either be measured directly or converted to a DC signal and then measured. An inverter may use the measured current to regulate output power.

SUMMARY

According to various aspects and embodiments, a power device is provided. The power device includes an input configured to receive input power, an output configured to provide output power to a load, a power conversion circuit coupled to the input and configured with a first output line and a second output line, the first output line coupled to the output and configured to provide output current at the output, a capacitor coupled to a junction of the first output line and the output, and coupled to the second output line, and a controller coupled to the power conversion circuit. The controller is configured to receive a first current measurement for the first output line receive a first voltage measurement across the capacitor, and determine a load current based on the first current measurement and the first voltage measurement.

According to one embodiment, the controller may be further configured to calculate a first capacitor value for the capacitor, and calculate a first derivative voltage value based on the first voltage measurement. In addition, the calculated first capacitor value may be calculated at startup of the power device based on a known load value, and wherein the calculated first capacitor value is calculated based on dividing the first current measurement by the first derivative voltage value. Also, the controller may be further configured to calculate a second derivative voltage value based on the first voltage measurement, and calculate a second capacitor value for the capacitor, wherein the second capacitor value is based on dividing the first current measurement by the second derivative voltage value.

According to another embodiment, the controller may be further configured to determine a mean capacitor value based on at least one previously calculated capacitor value and the second capacitor value, the at least one previously calculated capacitor value including the calculated first capacitor value, determine an adjustment value, and adjust the calculated first capacitor value based on scaling the calculated first capacitor value by the adjustment value. Further, the power device may be configured to periodically determine the mean capacitor value once per hour.

According to yet another embodiment, the power device may be configured such that the adjustment value decreases the calculated first capacitor value by up to one percent of the calculated first capacitor value.

In at least one embodiment, the controller may be further configured to calculate a second current value by multiplying the calculated first capacitor value by the first derivative voltage value, and wherein the controller is further configured to calculate the load current based on a sum of the second current value and the first current measurement.

In one embodiment, the controller may be further configured to regulate power delivered by the power device to the load based on the load current. In addition, the power device further may include at least one Hall Effect Sensor (HES), wherein the at least one HES is coupled to the first output line and the controller, wherein the first current measurement is measured by the at least one HES.

In at least one embodiment, the power device comprises an uninterruptable power supply.

According to another embodiment, a method of determining a load current for a load coupled to an output of a power device is provided. The method includes acts of measuring a first current of a first output line, measuring a first voltage across a capacitor, calculating a first derivative voltage value based on the first voltage, and determining a load current based on the first current and the first derivative voltage value.

The method may further include the act of calculating a first capacitor value at startup of the power device based on a known load value wherein the first capacitor value is calculated based on dividing the first current by the first derivative voltage value of the first voltage. In addition, the method may include acts of calculating a second derivative voltage value based on the first voltage, and calculating a second capacitor value for the capacitor, wherein the second capacitor value is based on dividing the first current by the second derivative voltage value.

The method may further include acts of determining a mean capacitor value based on at least one previously calculated capacitor value, the at least one previously calculated capacitor value including the calculated first capacitor value, determining an adjustment value, and adjusting the calculated first capacitor value based on scaling the calculated first capacitor value by the adjustment value. In addition, the method may further include the act of determining a second current value by multiplying the calculated first capacitor value by the first derivative voltage value, wherein the load current is based on summing the second current value and the first current. Still further, the method may include the act of regulating power delivered by the power device to the load based on the load current.

According to another embodiment a power device is provided. The power device includes an input configured to receive input power, an output configured to provide output power, a power conversion circuit coupled to the input and configured with a first output line and a second output line, the first output line coupled to the output and configured to provide output current at the output, a capacitor coupled to the first output line, and to the second output line, and means for determining a load current for the output based on a voltage across the capacitor.

In one embodiment, the means for determining a load current for the output does not include a current transformer.

In yet another embodiment, the power device may include means for adjusting a calculated capacitor value during operation of the power device.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed subject matter. Particular references to examples and embodiments, such as "an embodiment," "an other embodiment," "some embodiments," "other embodiments," "an alternate embodiment," "various embodiments," "one embodiment," "at least one embodiments," "this and other embodiments" or the like, are not necessarily mutually exclusive and are intended to indicate that a particular feature, structure, or characteristic described in connection with the embodiment or example and may be included in that embodiment or example and other embodiments or examples. The appearances of such terms herein are not necessarily all referring to the same embodiment or example.

Furthermore, in the event of inconsistent usages of terms between this document and documents incorporated herein by reference, the term usage in the incorporated references is supplementary to that of this document; for irreconcilable inconsistencies, the term usage in this document controls. In addition, the accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
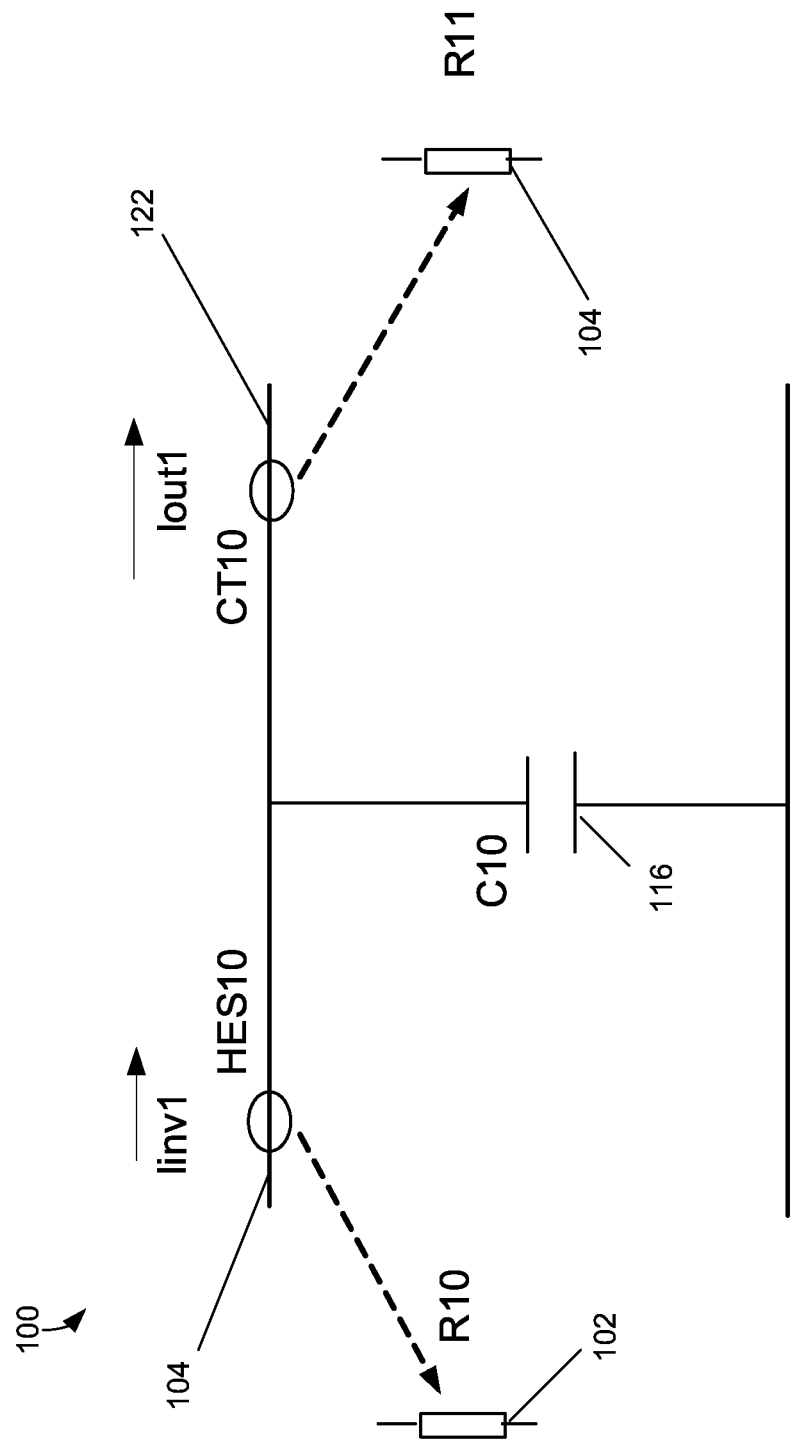
FIG. 1 provides a schematic diagram illustrating current in one phase of an inverter.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, the traditional approach to regulating the operations of an inverter within a UPS includes using a current transformer coupled to an output of the inverter to measure an output load. A CT may be voluminous and expensive. In addition, a measurement IC used to interface to the current transformer typically requires a burden resistor to convert the output of the CT into a voltage signal proportional to a current of the inverter output. The combination of the current transformer, the burden resistor, and the measurement IC requires calibration during manufacturing which can significantly increase manufacturing costs.

In addition, traditional approaches are subject to limitations such as measuring an inverter output current when a DC component is present. CTs are limited to AC applications and may be adversely affected by the presence of a DC component in inverter output current. Accordingly, an inaccurate measurement by a CT due to a DC component may disrupt normal inverter operations, and thus, may affect reliable operation of a UPS.

Another common approach to measuring inverter current includes using a Hall effect sensor (HES). An HES is capable of reliably measuring a current with a DC component whereas a CT cannot.

FIG. 1 provides a schematic diagram illustrating current in one output phase line of an inverter generally indicated at 100. The output phase line 100 includes a capacitor 116 coupled to a junction of an inverter line 104 and the inverter output line 122. An HES 102 is coupled to the inverter line 104 and configured to measure inverter current. A CT 104 is coupled to the inverter output line 122 and configured to measure an output load current of the inverter 100.

Figure 2:
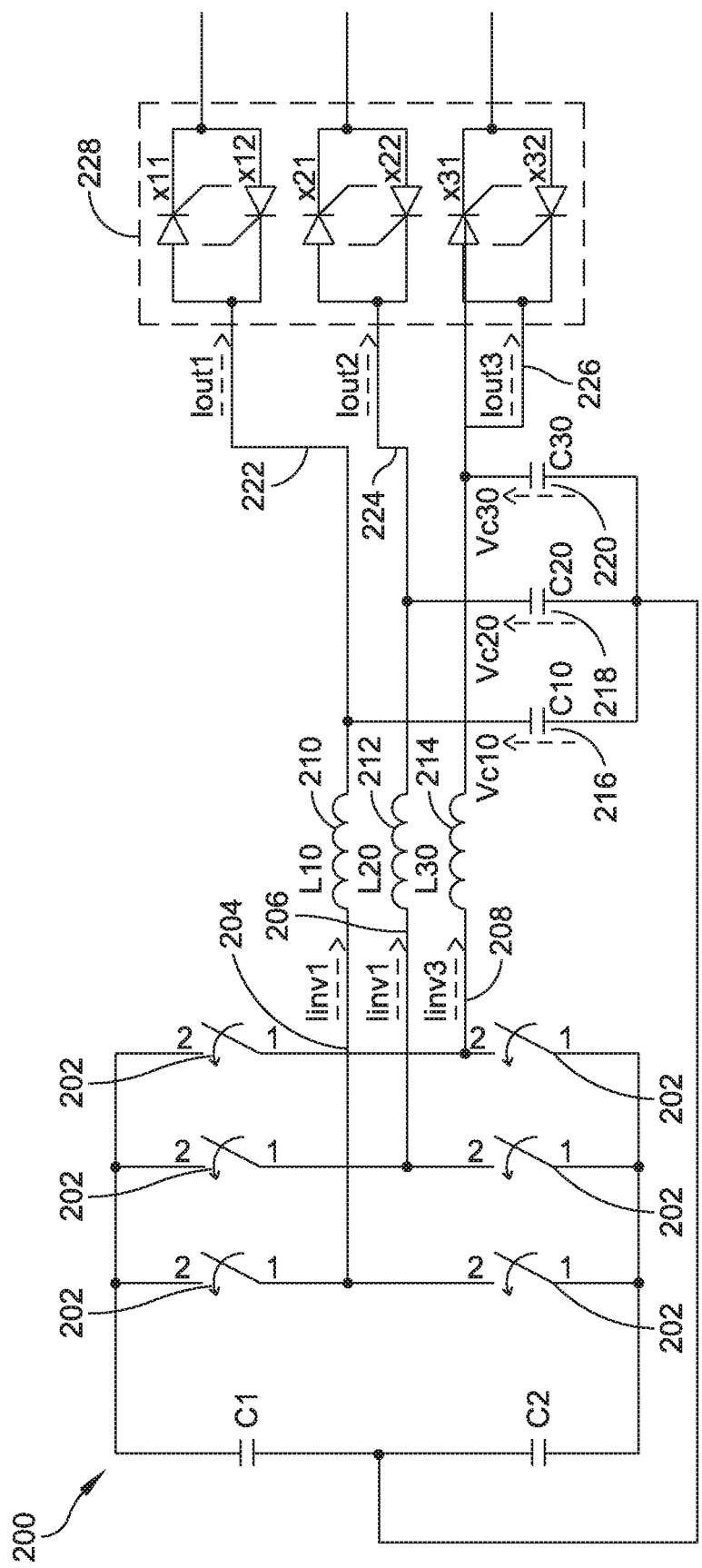
FIG. 2 illustrates one embodiment of an inverter according to aspects of the present disclosure.

FIG. 2 illustrates one example of an inverter 200 according to aspects and embodiments of the present disclosure. The inverter 200 includes switching devices 202, inverter lines 204, 206 and 208, inductors 210, 212 and 214, capacitors 216, 218 and 220, inverter output lines 222, 224 and 226, and static switches 228. In one embodiment, the inverter 200 is an AC/DC inverter used during operations of a UPS, such as the DC/AC inverter 412 of the UPS of FIG. 4 which is described below.

During operation of the inverter 200, the switching devices 202 are used to generate an AC waveform via the inverter lines 204, 206 and 208. The inverter lines 204, 206 and 208 are each coupled to one of the inductors 210, 212 and 214, respectively. Output current is supplied via the inductors 210, 212 and 214. Capacitors 216, 218 and 220 are used to filter the output current. A load (not shown) may be connected via the static switches 228 to receive filtered output AC current via the inverter output lines 222, 224 and 226.

Some embodiments disclosed herein include an approach to measure inverter output current without the use of a CT. In addition, aspects and embodiments disclosed herein include calculation of an output load current of an inverter irrespective of whether there is a DC component present in a coupled load. As discussed below with reference to the processes of FIGS. 5 and 6, the calculated output load current may be reliably used during regulation of the inverter 200 of FIG. 2.

Figure 3:
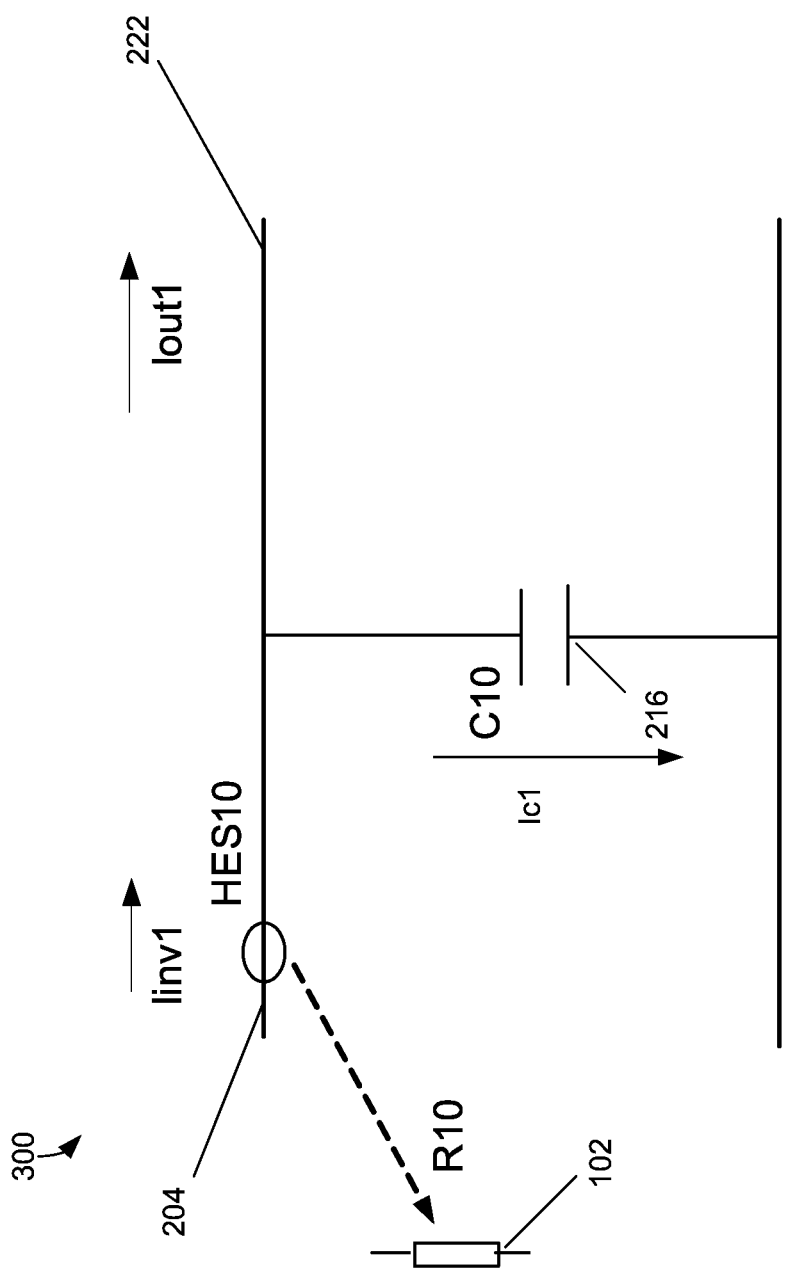
FIG. 3 provides another schematic diagram illustrating output current in one phase of an inverter according to aspects of the present disclosure.

FIG. 3 provides another schematic diagram 300 illustrating output current in one phase of the inverter 200 of FIG. 2. As discussed further below, the schematic diagram 300 will be used to demonstrate a process in accordance with at least one embodiment for determining output load current without use of a CT.

Based on Kirchhoff's current law, a load current at the inverter output 222 may be calculated as:

$$I_{out} = I_{inv} + I_c \quad (1)$$

where ($I_{out}$) is a load current at 222, ($I_{inv}$) is a current measured at the inverter line 204 and ($I_c$) is a current across the capacitor 216. The current of the capacitor 216 may be calculated as:

$$I_c = C \times \frac{\delta(V_c)}{\delta(t)} \quad (2)$$

where ($I_c$) is the current across the capacitor 216, (C) is a capacitor value, ($V_c$) is a derivative value of a capacitor voltage. Thus, an inverter output current, such as a load current measured at the inverter output 222, may be calculated using a derivative capacitor voltage using the following equation:

$$I_{out} = I_{inv} + C \times \left(\frac{\delta(V_c)}{\delta(t)}\right) \quad (3)$$

where ($I_{out}$) is the inverter output current, and ($I_{inv}$) is a current value measured at an inverter line, such as the inverter line 204 measured by the HES 102.

While Equation (3) may be used to theoretically determine a load current at the inverter output line 222 based on a theoretical capacitor value, consideration may be made as to the effect of aging on a capacitor. As a capacitor ages, the capacitive value of the capacitor typically decreases. As described further below with reference to FIG. 6, some embodiments herein disclose a method for continuously determining and adjusting a capacitor value used in output current calculations during the operation of an inverter, such as the inverter 200 of FIG. 2.

Figure 4:
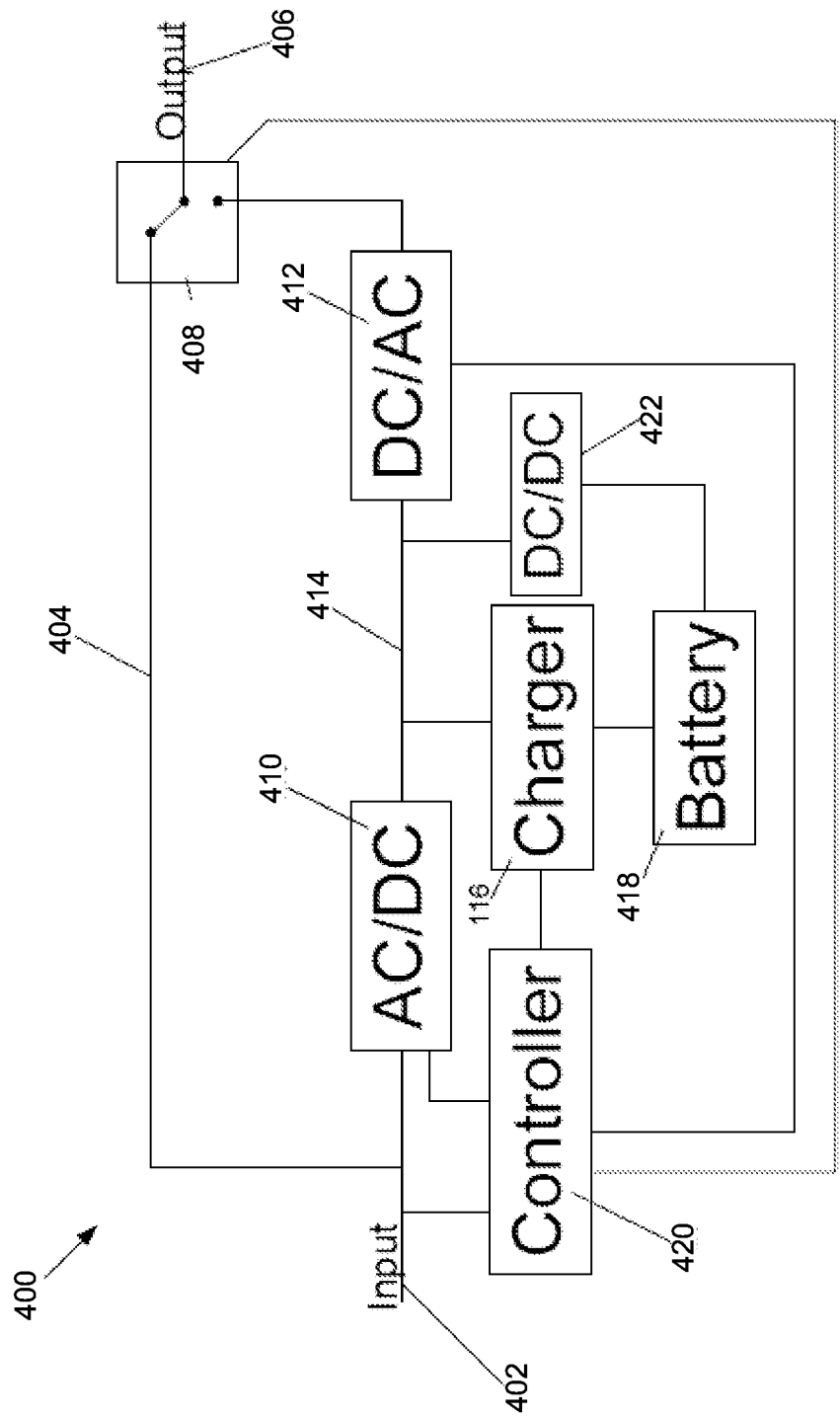
FIG. 4 is a block diagram of a uninterruptable power supply according to aspects and embodiments of the present disclosure.

FIG. 4 illustrates an online UPS 400 according to aspects of the current disclosure. The UPS 400 includes an input 402, an output 406, a bypass line 404, an AC/DC converter 410, a DC bus 414, a DC/AC inverter 412, a battery charger 416, a battery 418, a DC/DC converter 422, and a controller 420. The input 402 is configured to be coupled to an AC power source such as a utility power source and to the AC/DC converter 410. The input 402 is also selectively coupled to the output 406 via the bypass line 404 and the switch 408. The AC/DC converter 410 is also coupled to the DC/AC inverter 412 via the DC bus 414. The DC/AC inverter 412 is also selectively coupled to the output 406 via the switch 408. The battery 418 is coupled to the DC bus 414 via the battery charger 416 and also to the DC bus 414 via the DC/DC converter 422. The controller 420 is coupled to the input 402, the switch 408, the battery charger 416, the AC/DC converter 410, and the DC/AC inverter 412. In other embodiments, the battery 418 and the charger 416 may be coupled to the AC/DC converter 410.

Based on the quality of the AC power received from the utility source, the UPS 400 is configured to operate in different modes of operation. For example, according to one embodiment, the controller 420 monitors the AC power received from the utility source at the input 402 and, based on the monitored AC power, sends control signals to the switch 408, the battery charger 416, the AC/DC converter 410, and the DC/AC inverter 412 to control operation of the UPS 400.

The USP 400 may be configured to operate in several modes of operation. For example, the UPS 400 may have modes of operation including bypass, online, or battery. In one embodiment, the DC/AC inverter 412 is configured as the inverter 200 of FIG. 2. In both battery and online modes, the DC/AC inverter 412 may be used by the UPS 400 to measure output current at the output 406 to determine an output load current. The controller 420 may use the output load current during operation of the DC/AC inverter 412. For example, an output current may be determined for the output 406 based on a voltage measurement as described below. In at least one embodiment, the output load current may be used by the controller 420 to regulate the output of the inverter.

Figure 5:
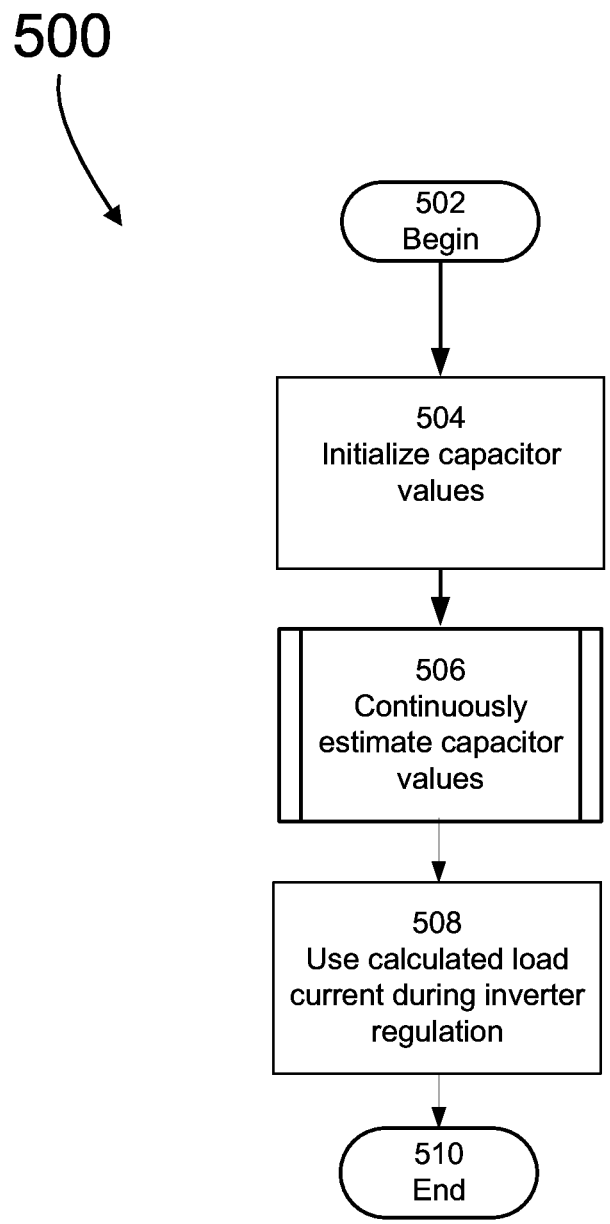
FIG. 5 is a flow diagram of one example of a method for calculating a load current of an inverter.

As discussed above with reference to FIG. 4, several embodiments perform processes that perform regulation of an inverter. In some embodiments, these regulation processes are executed by a controller, such as the controller 420. One example of an inverter regulation process is illustrated in FIG. 5. According to this example, the inverter regulation process 500 includes acts of acts of initializing capacitor values, continuously estimating capacitor values, calculating derivative voltage values, and using a calculated load current during regulation of the inverter. The process 500 begins in act 502.

In act 504, capacitor values are initialized. As described above with reference to FIG. 3 and Equation (3), an output current of an inverter may be calculated based on a known value of a capacitor, such as the capacitors 216, 218 and 220 of FIG. 2. In one embodiment, a load value of zero is used to determine capacitor values at startup. For example, at startup the static switching devices 228 are open, and thus, no load is coupled to the inverter 200. With a known value of $I_{out}$ (e.g., zero) Equation (3) may be written to determine initial capacitor values:

$$I_{inv} = -C \times \frac{\delta(V_c)}{\delta(t)} \quad (4)$$

Thus, $$C = -I_{inv} \div \left(\frac{\delta(V_c)}{\delta(t)}\right) \quad (5)$$

where C is a capacitor value, $(-I_{inv})$ is a current measured over a particular inverter line, such as the inverter line 204 of FIG. 3, and $\delta(V_c)/\delta(t)$ is a derivative value of a capacitor voltage. Once the capacitor value is determined, the inverter may continue operations for an indefinite amount of time. For example, the inverter 200 may operate for years without interruption.

As discussed above with reference to FIG. 3, capacitor values will typically change over time as a result of ageing and other factors. In act 506, the USP 400 continuously estimates capacitor values by measuring inverter current and capacitor voltages at a particular frequency. Returning to FIG. 3, impedances within an inverter will cause a substantial amount of current through the capacitor 216 at a particular frequency. For example, an inverter operating at 5 kHz will pass a majority of the current at 5 kHz through the capacitor 216. Therefore, the current at the inverter line 204 should be approximately equal to a current measured across the capacitor at 5 kHz. The following equation represents this approximation:

$$I_c(5\text{ kHz}) \sim I_{inv}(5\text{ kHz}) \quad (6)$$

where $(I_c)$ is the current across the capacitor, and $(I_{inv})$ is the current measured at the frequency of 5 kHz at the inverter line 204. Having established that the current at the inverter line 204 is approximately equal to the current across the capacitor 216 when the inverter is operating at a frequency of 5 kHz, the following equation may be given:

$$-C \times \left(\frac{\delta(Vc(5\text{ kHz}))}{\delta(t)}\right) \sim I_{inv}(5\text{ kHz}) \quad (7)$$

and thus, $$C \sim -I_{inv}(5\text{ kHz}) \div \left(\frac{\delta(Vc(5\text{ kHz}))}{\delta(t)}\right) \quad (8)$$

where (C) is an approximate value of the capacitor 216 based on a current of the inverter line 204 (Iinv), and a derivative value of a voltage of the capacitor 216 at a frequency of 5 kHz. As described further below with reference to FIG. 6, the approximated value of the capacitor 216 may decrease slowly over time and may be corrected (e.g., scaled) as necessary.

In act 508 a capacitor value may be used during inverter regulation. As discussed above with reference to FIG. 3 and Equation (1), a load current may be determined based on Kirchhoff's current law. For example, the capacitor value may be utilized in Equation (2) to determine a load current. The calculated load current may then be used during inverter regulation.

Figure 6:
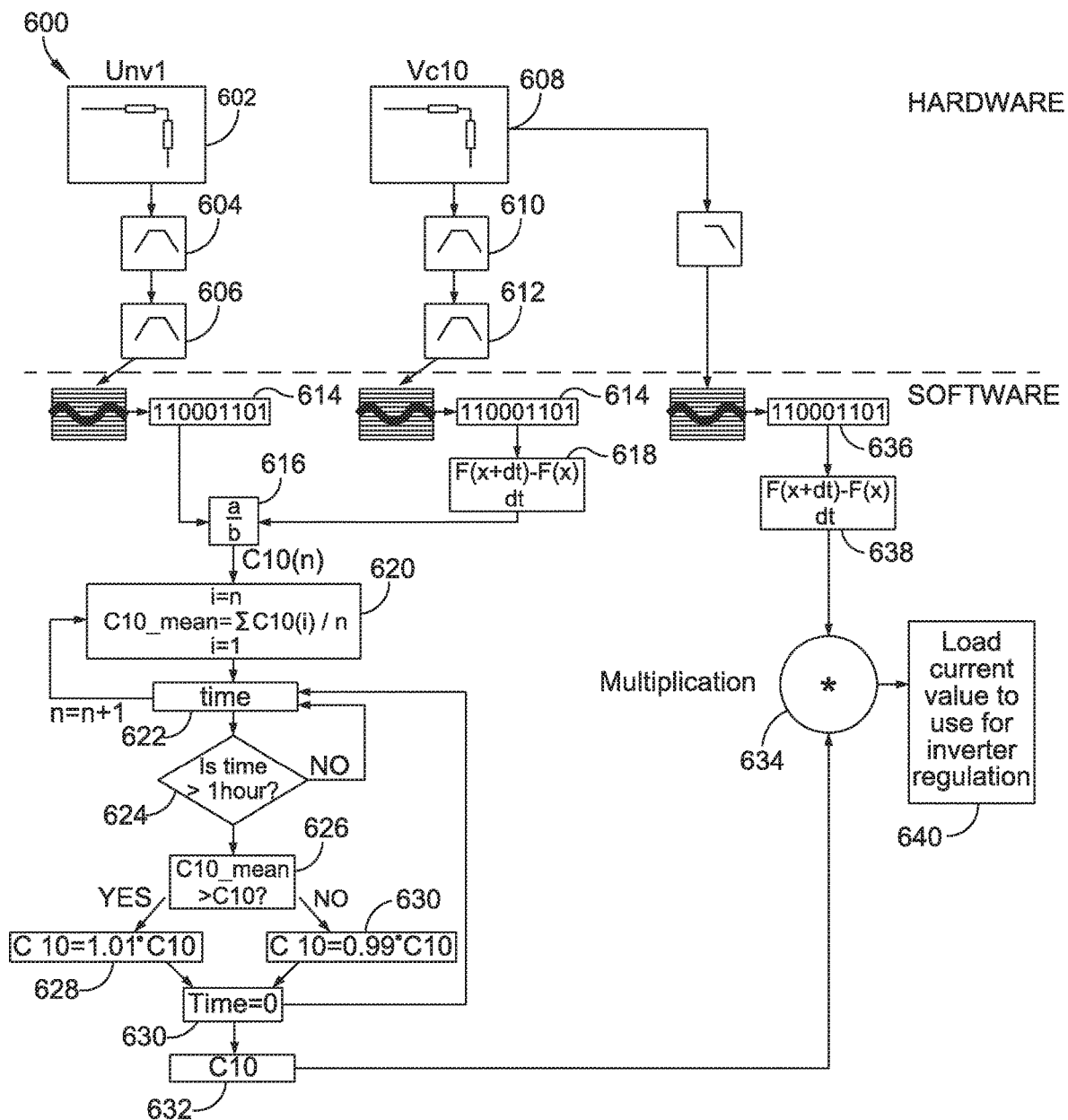
FIG. 6 is another flow diagram of one example of a method of calculating a load current of an inverter.

Referring now to FIG. 6, a flow diagram 600 is provided which illustrates one example of determining a load current in accordance with the acts 506 and 508 discussed above. In this example, a first current 602 is measured, such as a current at 5 kHz over the inverter line 204 of FIG. 2. The first current 602 may then be filtered by a two-stage low-pass filter such as low-pass filters 504 and 506 to filter out higher harmonics and extract a current value at a particular frequency, such as 5 kHz. At the same time the first current 602 is measured a first capacitor voltage 608 is measured, such as a voltage of capacitor 216. As discussed above with reference to FIGS. 3 and 5, at startup the initial capacitor value may be calculated (e.g., Equation (5)) based on a known inverter load (e.g., zero) and measuring an inverter line current and associated capacitor voltage. As described further below, the initial capacitor value is adjusted periodically during operation of the inverter 200. The first capacitor voltage 608 may similarly be filtered by low-pass filters 610 and 612.

The first current 602 and the first capacitor voltage 608 may then be received by a DSP coupled to an inverter, such as the controller 420 of FIG. 4 coupled to the inverter 402. The controller 420 may be configured with analog-to-digital converters to convert the first current 602 and the first capacitor voltage 608 into binary values 614 and digitally perform operations in accordance with aspects and embodiments disclosed herein. The controller 420 may determine a capacitor value 616 by utilizing Equation (8), which includes dividing the first current 602 by the reactive value 618 (e.g., the derivative capacitor voltage value) of the first capacitor voltage 608.

As discussed above with reference to FIGS. 3 and 5, a capacitor value is subject to change over time. In the shown embodiment, the controller 420 may periodically adjust the capacitor value 616 to account for fluctuations in capacitance due to capacitor aging. Adjustment may include tracking a first timer, determining if a predetermined period has passed, determining whether a capacitor value is greater than a calculated capacitor mean value, and adjusting a resulting capacitor value accordingly. In act 620, a mean for the capacitor value is calculated to filter noise and errors. The mean may be based on the capacitor value 616 being integrated and averaged with previously calculated capacitor values. In act 622, a timer is incremented. In one embodiment, each instance the timer is incremented, the capacitor value 616 is stored for subsequent integration and averaging.

In act 624, the controller 420 determines if the timer value indicates a predetermined period has elapsed. In one embodiment, the predetermined period may be one hour. In other embodiments, the predetermined period may be greater than an hour or less than an hour. The controller 420 continues to monitor the timer value at 622 if the predetermined period has not elapsed. After the predetermined period has elapsed, in act 626 the mean of the previously calculated capacitor values calculated in the act 620 is compared to the initial capacitor value calculated in act 504 of FIG. 5.

In act 628, the controller 420 may determine that the mean of the previously calculated capacitor values is greater than the initial capacitor value. In this instance, the initial capacitor value may be scaled upwards by 1%. In act 630, the controller 420 may determine that the mean of the previously calculated capacitor values is less than initial capacitor value. In this instance, the initial capacitor value may be scaled downwards by 1%. In act 632, the controller 420 may reset the timer and return to act 622. It should be understood that a scaling percentage other than 1% may be used and is not intended to be limiting. In act 632, the initial capacitor value may be stored with an adjustment made in the act 628 or 630.

In the shown embodiment, the first capacitor voltage value 608 may be filtered with a low-pass filter arrangement to determine the derivative capacitor voltage 636. The controller 420 may be configured with an analog-to-digital converter and may convert the filtered first capacitor voltage value 608 into a binary value 636. The controller 420 may further determine a derivative capacitor voltage value 638 based on the binary value 636.

In act 634, the controller 420 may determine a current value for the capacitor (e.g., $I_c$) using Equation (2) by utilizing the initial capacitor value (as modified and stored in the act 632) and the derivative capacitor voltage value 638. In act 640, a load current may be calculated based on summing a current measured over an inverter line and the current value for the capacitor determined in act 634 (e.g., Kirchhoff's Current Law). For example, a current measured over the inverter line 204 may be summed with a current value calculated over the capacitor 216. As discussed above with reference to the act 508 of FIG. 5, the calculated load current value may be used in inverter regulation during the operation of the inverter.

Some embodiments disclosed herein include an inverter which may determine a load current of an inverter without expensive hardware, such as a current transformer and associated circuitry, which takes up valuable space in a UPS. In these embodiments, factory calibration of a current transformer may be obviated further reducing costs. In addition, some embodiments herein include an inverter which is fully compatible with determining a load current even when a load consumes a DC component current. Still further, some embodiments herein include methods which may be included an existing PDUs such as UPS units. For example, a calculated load current may be used by existing inverter regulation hardware and software processes.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A power device comprising:
an input configured to receive input power;
an output configured to provide output power to a load;
a power conversion circuit coupled to the input and configured with a first output line and a second output line, the first output line coupled to the output and configured to provide output current at the output;
a capacitor coupled to a junction of the first output line and the output, and coupled to the second output line; and
a controller coupled to the power conversion circuit and configured to:
receive a first current measurement for the first output line;
receive a first voltage measurement across the capacitor; and
determine a load current based on the first current measurement and the first voltage measurement.

2. The power device of claim 1, wherein the controller is further configured to: calculate a first capacitor value for the capacitor; and
calculate a first derivative voltage value based on the first voltage measurement.

3. The power device of claim 2, wherein the calculated first capacitor value is calculated at startup of the power device based on a known load value, and wherein the calculated first capacitor value is calculated based on dividing the first current measurement by the first derivative voltage value.

4. The power device of claim 3, wherein the controller is further configured to:
calculate a second derivative voltage value based on the first voltage measurement; and
calculate a second capacitor value for the capacitor, wherein the second capacitor value is based on dividing the first current measurement by the second derivative voltage value.

5. The power device of claim 4, wherein the controller is further configured to:
determine a mean capacitor value based on at least one previously calculated capacitor value and the second capacitor value, the at least one previously calculated capacitor value including the calculated first capacitor value;
determine an adjustment value; and
adjust the calculated first capacitor value based on scaling the calculated first capacitor value by the adjustment value.

6. The power device of claim 5, wherein the power device is configured to periodically determine the mean capacitor value once per hour.

7. The power device of claim 5, wherein the power device is configured such that the adjustment value decreases the calculated first capacitor value by up to one percent of the calculated first capacitor value.

8. The power device of claim 2, wherein the controller is further configured to calculate a second current value by multiplying the calculated first capacitor value by the first derivative voltage value, and wherein the controller is further configured to calculate the load current based on a sum of the second current value and the first current measurement.

9. The power device of claim 1, wherein the controller is further configured to regulate power delivered by the power device to the load based on the load current.

10. The power device of claim 1, wherein the power device further includes at least one Hall Effect Sensor (HES), wherein the at least one HES is coupled to the first output line and the controller, wherein the first current measurement is measured by the at least one HES.

11. The power device of claim 1, wherein the power device comprises an uninterruptable power supply.

12. A method for determining a load current for a load coupled to an output of a power device, the method comprising:
measuring a first current of a first output line;
measuring a first voltage across a capacitor;

calculating a first derivative voltage value based on the first voltage; and determining a load current based on the first current and the first derivative voltage value.

13. The method of claim 12, further comprising calculating a first capacitor value at startup of the power device based on a known load value wherein the first capacitor value is calculated based on dividing the first current by the first derivative voltage value of the first voltage.

14. The method of claim 13, further comprising:

calculating a second derivative voltage value based on the first voltage; and calculating a second capacitor value for the capacitor, wherein the second capacitor value is based on dividing the first current by the second derivative voltage value.

15. The method of claim 14, further comprising:

determining a mean capacitor value based on at least one previously calculated capacitor value, the at least one previously calculated capacitor value including the calculated first capacitor value;

determining an adjustment value; and adjusting the calculated first capacitor value based on scaling the calculated first capacitor value by the adjustment value.

16. The method of claim 15, further comprising determining a second current value by multiplying the calculated first capacitor value by the first derivative voltage value, wherein the load current is based on summing the second current value and the first current.

17. The method of claim 16, further comprising regulating power delivered by the power device to the load based on the load current.

18. A power device comprising:

an input configured to receive input power;

an output configured to provide output power;

a power conversion circuit coupled to the input and configured with a first output line and a second output line, the first output line coupled to the output and configured to provide output current at the output;

a capacitor coupled to the first output line, and to the second output line; and means for determining a load current for the output based on a voltage across the capacitor.

19. The power device of claim 18, wherein the means for determining a load current for the output does not include a current transformer.

20. The power device of claim 18, further comprising means for adjusting a calculated capacitor value during operation of the power device.

21. The power device of claim 1, wherein the output is configured to provided output AC current to the load.

22. The method of claim 12, further comprising providing an output AC current to the load.

23. The power device of claim 18, wherein the output is configured to provide output AC power to the load.

* * * * *